(12) United States Patent
Meehan

(10) Patent No.: US 10,135,212 B2
(45) Date of Patent: Nov. 20, 2018

(54) ELECTRIC CIRCUIT JUMPER WITH COUPLING

(71) Applicant: Hughie Meehan, Landenberg, PA (US)

(72) Inventor: Hughie Meehan, Landenberg, PA (US)

(*) Notice: Subject to any disclaimer, the term of this patent is extended or adjusted under 35 U.S.C. 154(b) by 0 days.

(21) Appl. No.: 15/297,571

(22) Filed: Oct. 19, 2016

(65) Prior Publication Data
US 2018/0109056 A1 Apr. 19, 2018

(51) Int. Cl.
H01R 31/08 (2006.01)
G01R 1/00 (2006.01)
H01R 13/684 (2011.01)
H01R 11/18 (2006.01)

(52) U.S. Cl.
CPC ............. *H01R 31/08* (2013.01); *G01R 1/00* (2013.01); *H01R 11/18* (2013.01); *H01R 13/684* (2013.01); *H01R 2201/20* (2013.01)

(58) Field of Classification Search
CPC . H01R 4/28; H01R 31/06; H01R 9/05; G01R 19/00
USPC .... 439/507, 508, 564, 678, 675, 578, 699.1, 439/620.26
See application file for complete search history.

(56) References Cited

U.S. PATENT DOCUMENTS

| | | | | |
|---|---|---|---|---|
| 3,292,117 A | * | 12/1966 | Bryant | ................. H01R 24/542 174/151 |
| 3,321,732 A | * | 5/1967 | Forney, Jr. | ........... H01R 9/0503 439/322 |
| 3,851,149 A | | 11/1974 | Daley | |
| 4,211,456 A | | 7/1980 | Sears | |
| 4,846,731 A | * | 7/1989 | Alwine | ................. H01R 24/542 439/642 |
| 5,062,808 A | * | 11/1991 | Hosler, Sr. | ........... H01R 24/542 439/580 |
| 5,242,316 A | * | 9/1993 | Gartzke | ............... H01R 9/0527 439/584 |
| 5,816,059 A | | 10/1998 | Ficchi, Jr. et al. | |

(Continued)

FOREIGN PATENT DOCUMENTS

| | | |
|---|---|---|
| CN | 201450133 U | 5/2010 |
| CN | 104241887 A | 6/2013 |
| FR | 2490415 A1 | 3/1982 |

OTHER PUBLICATIONS

Abstract of FR2490415, dated Mar. 19, 1982, 2 pages.

(Continued)

*Primary Examiner* — Hae Moon Hyeon
(74) *Attorney, Agent, or Firm* — Barley Snyder

(57) ABSTRACT

An electric circuit jumper having a coupling that electrically connects a first electrical connector and a second electrical connector that are to be connected, respectively, with a first point of electric circuit and a second point of the electric circuit. A first probe, intended to be electrically connected to the first point in the electric circuit, is electrically connected to the first electrical connector and a second probe, intended to be electrically connected to the second point in the electric circuit, is electrically connected to the second electrical connector. The electric circuit is bypassed by electrically jumping from the first point of the electric circuit to the second point of the electric circuit via the first probe, the first electrical connector, the coupling, the second electrical connector, and the second probe.

25 Claims, 9 Drawing Sheets

(56) References Cited

U.S. PATENT DOCUMENTS

| | | | | |
|---|---|---|---|---|
| 6,126,487 | A * | 10/2000 | Rosenberger | H01R 24/542 439/675 |
| 6,827,608 | B2 * | 12/2004 | Hall | H01R 13/6315 439/578 |
| 6,869,316 | B2 * | 3/2005 | Hinkle | H01R 24/38 439/578 |
| 6,981,895 | B2 * | 1/2006 | Potega | H01R 24/58 439/218 |
| 7,109,700 | B2 * | 9/2006 | Fazzina | G01R 1/06788 324/115 |
| 7,128,604 | B2 * | 10/2006 | Hall | H01R 24/542 439/485 |
| 7,217,160 | B2 * | 5/2007 | Hsu | H01R 24/542 439/538 |
| 8,016,599 | B1 | 9/2011 | Melby et al. | |
| 8,033,864 | B1 * | 10/2011 | Cho | H01R 24/30 439/620.26 |
| 8,888,527 | B2 * | 11/2014 | Chastain | H01R 24/542 439/578 |
| 2011/0117783 | A1 * | 5/2011 | Su | H01R 13/688 439/620.26 |
| 2015/0079811 | A1 | 3/2015 | Yi | |

OTHER PUBLICATIONS

Abstract of CN201450133, dated May 5, 2010, 1 page.
Abstract of CN104241887, dated Dec. 24, 2014, 1 page.
English machine translation of FR2490415, dated Mar. 19, 1982, 4 pages.

* cited by examiner

US 10,135,212 B2

ELECTRIC CIRCUIT JUMPER WITH COUPLING

FIELD OF THE INVENTION

The invention relates, in general, to testing and troubleshooting electric circuits and, in particular, to an electric circuit jumper that bypasses a portion of an electric circuit when the electric circuit is undergoing testing and troubleshooting.

BACKGROUND

It is common practice, while testing and troubleshooting electric circuits, to bypass parts of the electric circuits with an electric circuit jumper, while operation of other parts of the electric circuits are being observed. Currently available electric circuit jumpers and other hand tools used to bypass parts of electric circuits fail to satisfy the concurrent requirements of safety, efficiency, adaptability, and cost.

SUMMARY

An electric circuit jumper, constructed in accordance with the invention, includes a first probe having an electrically conductive tip adapted for making electrical connection with a first point in an electrical circuit and a second probe having an electrically conductive tip adapted for making electrical connection with a second point in the electrical circuit. This electric circuit jumper also includes a coupling having a first electrical contact zone and a second electrical contact zone electrically connected to the first electrical contact zone of coupling. An electric circuit jumper, constructed in accordance with the invention, further includes a first electrical connector at a first end of the coupling in electrical contact with the first electrical contact zone in the coupling and a second electrical connector at a second end of the coupling in electrical contact with the second electrical contact zone in the coupling. This electric circuit jumper also includes a first wire extending from the tip of the first probe to the first electrical connector and a second wire extending from the tip of the second probe to the second connector.

DETAILED DESCRIPTION OF THE EMBODIMENT(S)

Figure 1A:
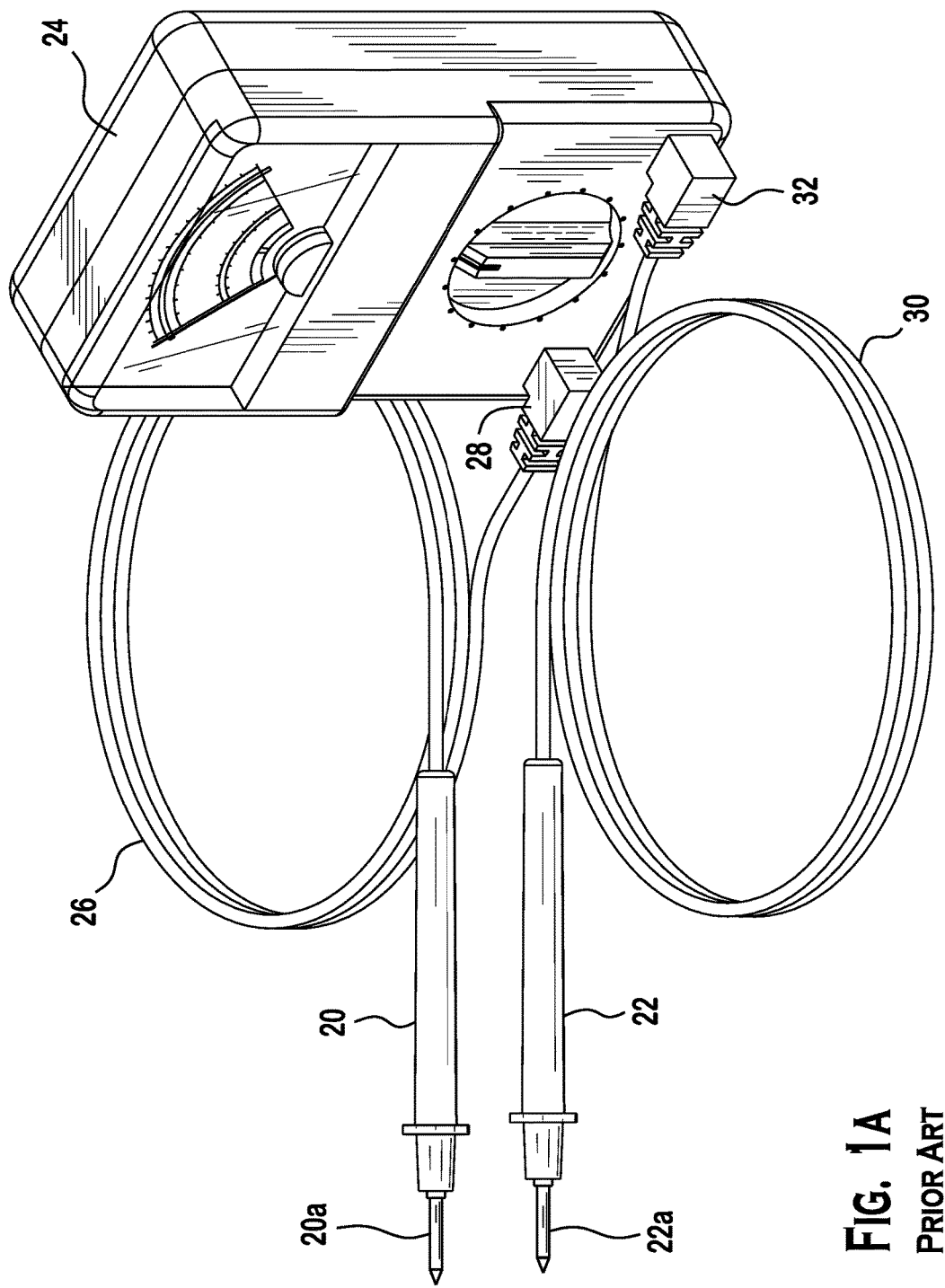
FIG. 1 is a perspective view of a known voltmeter.
Figure 2:
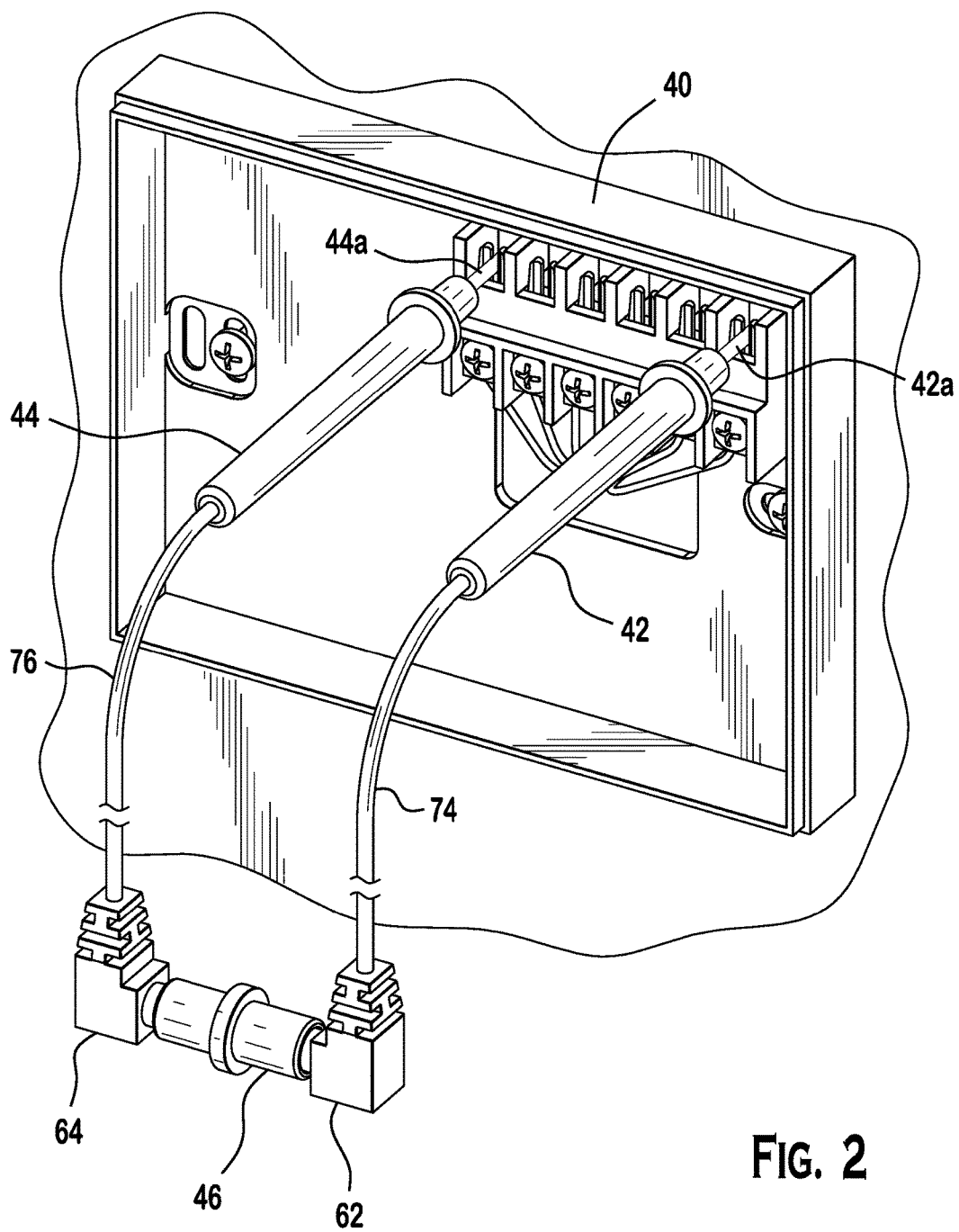
FIG. 2 is a perspective view of an electric circuit jumper, constructed in accordance with the invention, and connected to electrical connectors an electrical unit undergoing testing or troubleshooting.
Figure 3:
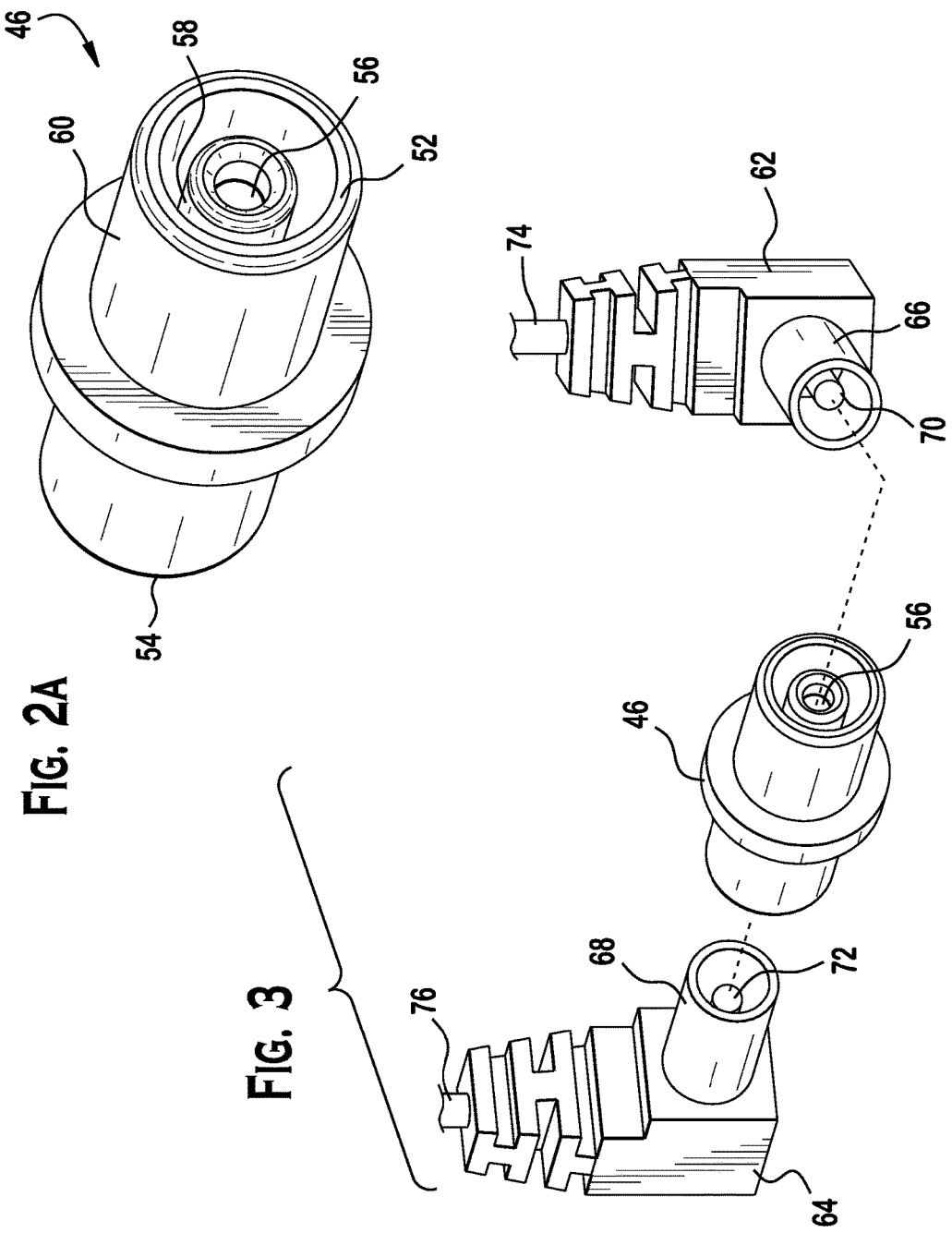
FIG. 3 is an exploded perspective view of the electric circuit jumper of FIG. 2.
Figure 4:
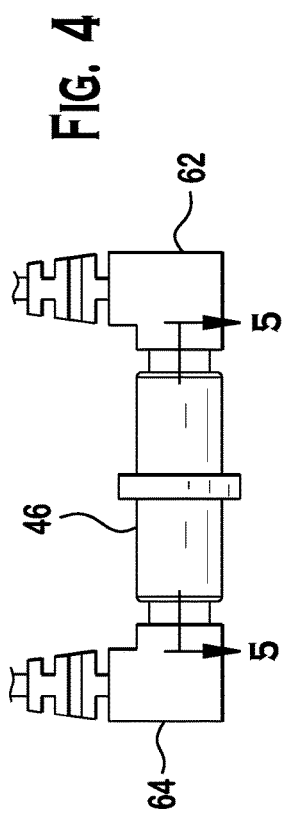
FIG. 4 is a front view of the electric circuit jumper of FIG. 2.

Referring to FIG. 1, a known voltmeter of conventional construction and operation is shown. The known voltmeter generally includes a first probe 20 that has an electrically conductive tip 20a adapted for making electrical contact with a first point in an electric circuit and a second probe 22 that has an electrically conductive tip 22a adapted for making electrical contact with a second point in the electric circuit. The first probe 20 is electrically connected to a voltmeter circuit located within the voltmeter housing 24 by a wire 26 and an electrical connector 28. The second probe 22 is electrically connected to the voltmeter circuit located within the voltmeter housing 24 by a wire 30 and an electrical connector 32. It is well known that the first probe 20 and the second probe 22 can be removed from the voltmeter housing 24. The known the first probe 20 can be easily removed from the voltmeter housing 24 by pulling out the electrical connector 28. Likewise, the second probe 22 can be removed from the voltmeter housing 24 by pulling out the electrical connector 32. Accordingly, the first probe 20 and the second probe 22 could be connected together to test and troubleshoot an electrical circuit.

FIGS. 2 through 5 illustrate an exemplary embodiment of an electric circuit jumper constructed in accordance with the invention being used with an electrical unit 40, for example a thermostat. This electric circuit jumper includes a first probe 42 having an electrically conductive tip 42a inserted in a connection in electrical unit 40, thereby making electrical connection with a first point in the electric circuit in electrical unit 40. The electric circuit jumper also includes a second probe 44 having an electrically conductive tip 44a inserted in a connection in electrical unit 40, thereby making electrical connection with a second point in the electric circuit in electrical unit 40.

The electric circuit jumper illustrated in FIGS. 2 through 5 also includes a coupling 46 having a first electrical contact zone 48 and a second electrical contact zone 50 electrically connected to the first electrical contact zone 48. As shown most clearly in FIG. 5, the first electrical contact zone 48 is positioned at a first end 52 of the coupling 46 and the second electrical contact zone 50 is positioned at a second end 54 of the coupling 46. For the shown embodiment, the coupling 46 is barrel shaped. It will be apparent that coupling 46 can take various other forms and shapes. As shown most clearly in FIG. 5 (and also in FIG. 8), the first electrical contact zone 48 in coupling 46 and second electrical contact zone 50 in the coupling 46 are ends of an electrically conductive tubular sleeve 56.

Figure 5:
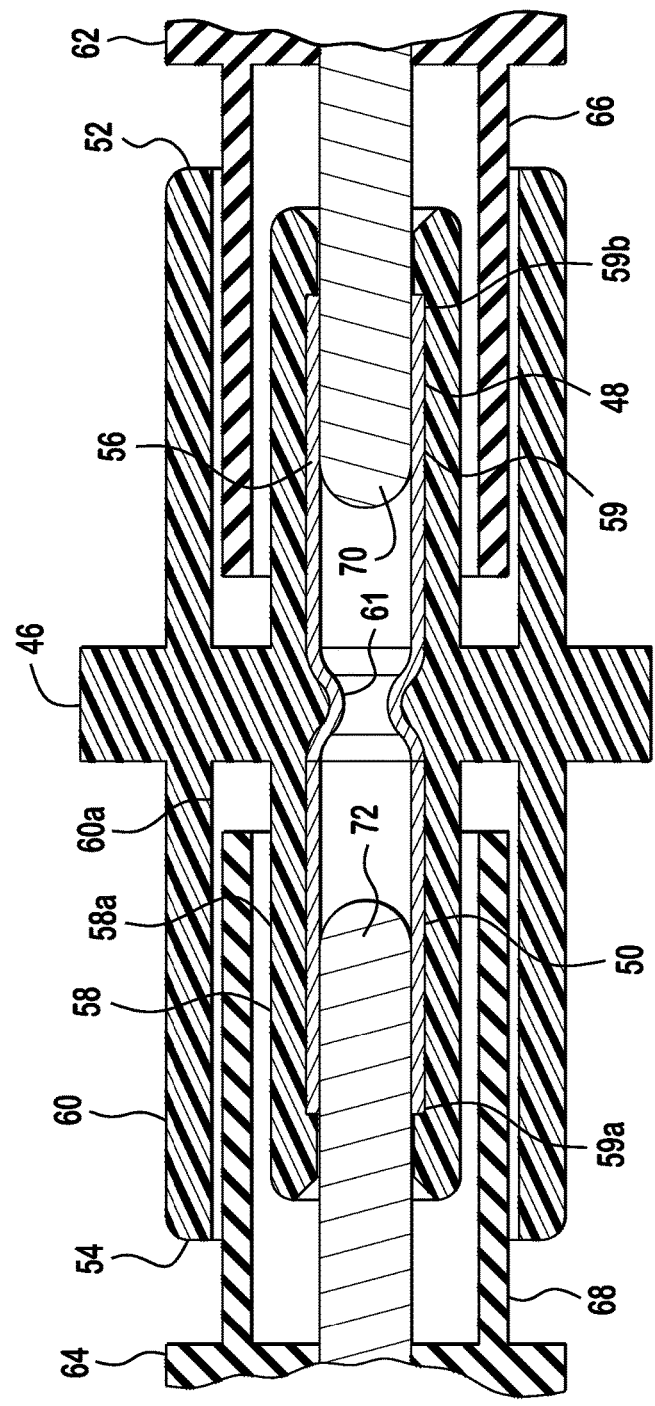
FIG. 5 is a sectional view, on an enlarged scale, of the of the electric circuit jumper taken along line 5-5 of FIG. 4.

As shown most clearly in FIG. 5, the coupling 46 also includes an insulation sleeve 58 surrounding the electrically conductive tubular sleeve 56. The electrically conductive tubular sleeve 56 is fitted within a recess 59 of insulation sleeve 58. As shown, the electrically conductive tubular sleeve 56 is secured and restrained from moving, relative to the insulation sleeve 58, by shoulders 59a and 59b. The shoulders 59a and 59b are positioned at the opposite ends of recess 59. An annular dimple 61 at the middle of electrically conductive tubular sleeve 56 also restrains movement of the electrically conductive tubular sleeve relative to insulation sleeve 58.

The coupling 46 also includes an outer tubular shell 60. An inner surface 60a of outer tubular shell 60 is spaced from an outer surface 58a of insulation sleeve 58.

An electric circuit jumper, constructed in accordance with the invention, also includes a first electrical connector 62 disposed at first end 52 of coupling 46 that is in electrical contact with first electrical contact zone 48 in coupling 46. The electric circuit jumper, constructed in accordance with the invention, further includes a second electrical connector 64 disposed at second end 54 of coupling 46 and is in electrical contact with second electrical contact zone 50 in coupling 46. More specifically, first electrical connector 62 includes a first cylindrical shell 66 that is closed at one end and extends into a space between an inner surface 60a of outer tubular shell 60 of coupling 46 and an outer surface 58a of the insulation sleeve 58. The second electrical connector 64 includes a second cylindrical shell 68 that is closed at one end and also extends into the space between inner surface 60a of outer tubular shell 60 of coupling 46 and the outer surface 58a of insulation sleeve 58.

The first electrical connector 62 includes an electric terminal 70 that is fixed to the closed end of first cylindrical shell 66 of first electrical connector 62 in the shown embodiment. The second electrical connector 64 includes an electric terminal 72 secured to the closed end of the second cylindrical shell 68 of the electrical connector 64. The electric terminal 70 is press-fit in a first end of the electrically conductive tubular sleeve 56, namely at first electrical contact zone 48 of the electrically conductive tubular sleeve 56. The electric terminal 72 is press-fit in a second end of electrically conductive tubular sleeve 56, namely at second electrical contact zone 50 of the electrically conductive tubular sleeve 56.

An electric circuit jumper, constructed in accordance with the invention, further includes a first wire 74 extending from electrically conductive tip 42a of first probe 42 through the first probe to the electric terminal 70 in first electrical connector 62 and a second wire 76 extending from the electrically conducive tip 44a of the second probe 44 through the second probe to the electric terminal 72 in the second electrical connector 64. As a result, the electrically conductive tip 42a of probe 42 is electrically connected to the electrically conductive tip 44a of the probe 44 through the first wire 74, the electric terminal 70 in the electrical connector 62, the electrically conductive tubular sleeve 56 in coupling 46, the electric terminal 72 in the electrical connector 64, and the second wire 76.

It is apparent from the above description of an electric circuit jumper according to the invention that this electric circuit jumper can include probes and electrical connectors similar to those used with voltmeters of conventional construction and operation. It is also apparent that the probes and electrical connectors of an electric circuit jumper, constructed in accordance with the invention, can be formed and constructed in a number of other ways.

Figure 6:
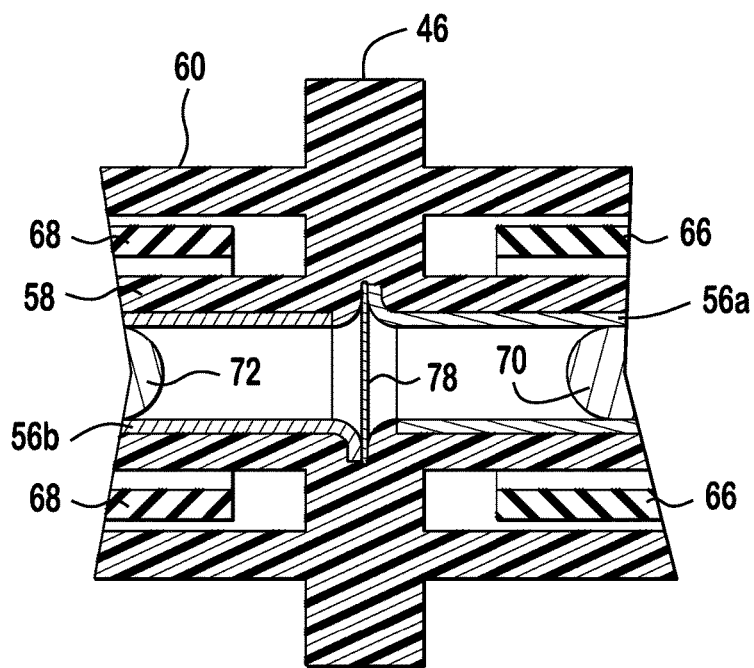
FIG. 6 is a sectional view of an alternative design of a portion of the electric circuit jumper shown in FIG. 5.

FIG. 6 illustrates an alternative design for a portion of coupling 46. In FIG. 6, the electrically conductive tubular sleeve is a series connection of two separate electrically conductive tubular sleeves 56a and 56b. In the shown embodiment, the electrically conductive tubular sleeves 56a and 56b connect together electrically by a resistance component 78, such as a fuse, that protects against current surges in coupling 46. The resistance component 78 can be rated at defined amperage A, such as 5A, to interrupt excessive current so that further damage by overheating or fire is prevented.

Figure 7:
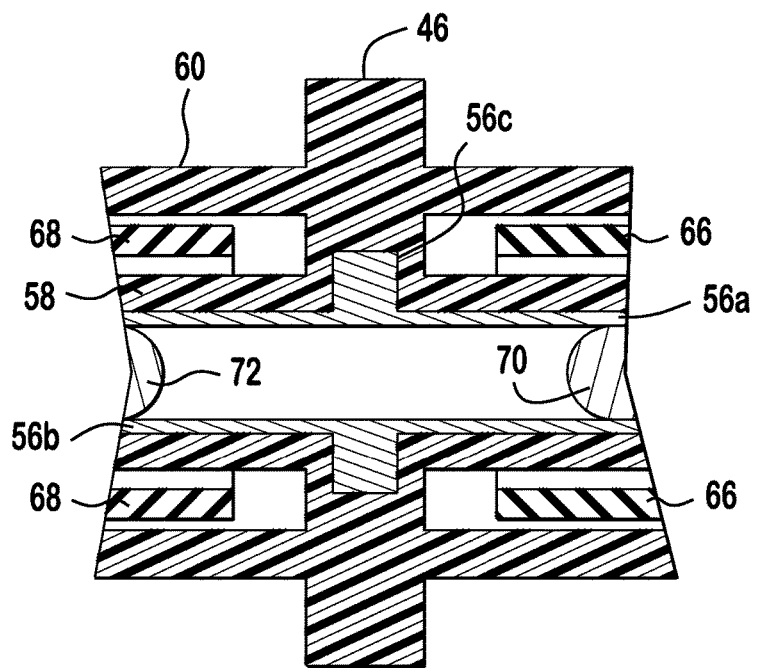
FIG. 7 is a sectional view of another alternative design of a portion of the electric circuit jumper shown in FIG. 5.

In FIG. 7, which illustrates another alternative design for a portion of coupling 46, electrically conductive tubular sleeve 56 has a flange 56c that extends into insulation sleeve 58 of the coupling restraining relative movement between the electrically conductive tubular sleeve 56 and the insulation sleeve 58.

Figure 8:
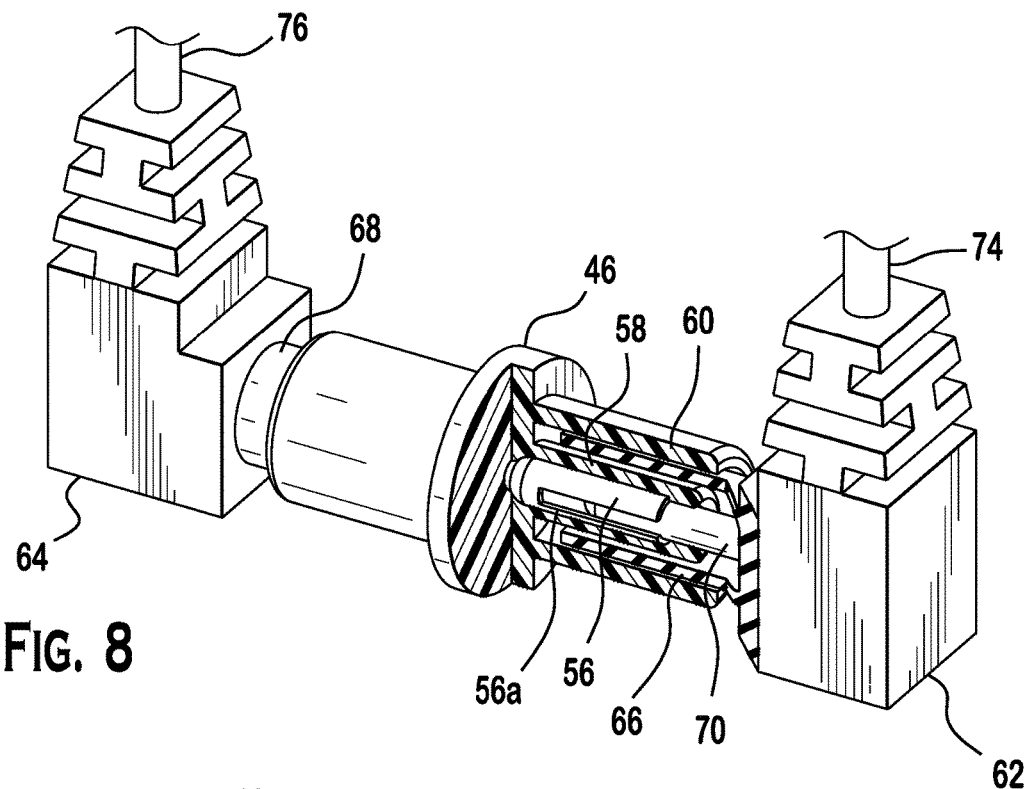
FIG. 8 is a perspective view, partially in section, of another alternative design of the electric circuit jumper shown in FIG. 5.
Figure 9:
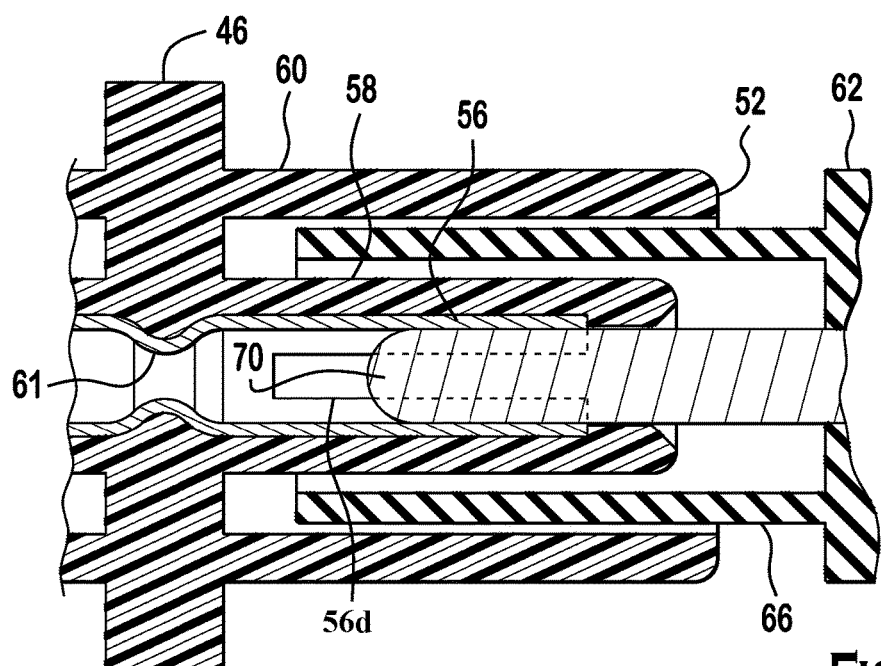
FIG. 9 is a sectional view, on an enlarged scale, of a portion of the electric circuit jumper shown in FIG. 8.

FIGS. 8 and 9 show an electrically conductive tubular sleeve 56 having a slot 56d extending axially of the electrically conductive tubular sleeve 56. One or more such slots in electrically conductive tubular sleeve 56 provide added flexibility to the electrically conductive tubular sleeve 56.

Figure 10:
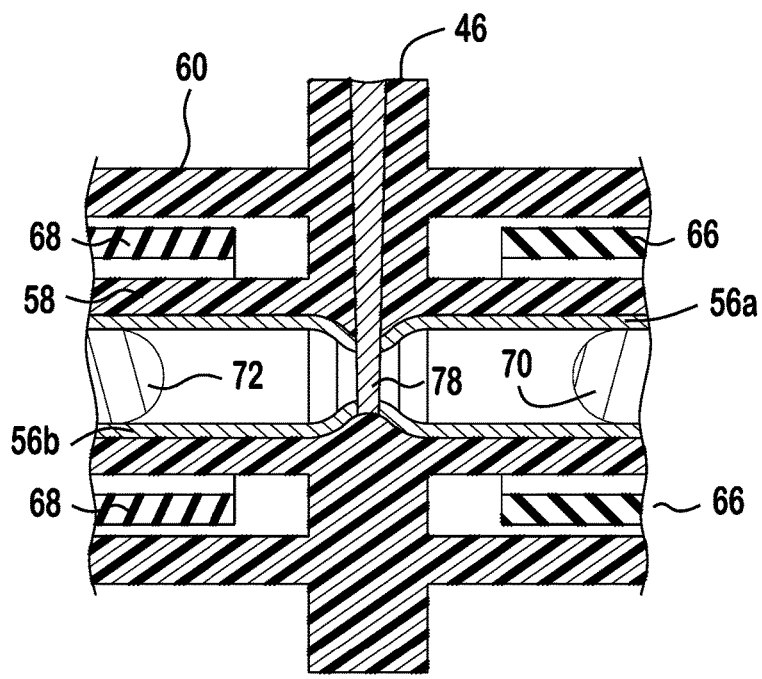
FIG. 10 is a sectional view of another alternative design of a portion of the of the electric circuit jumper shown in FIG. 5.
Figure 11:
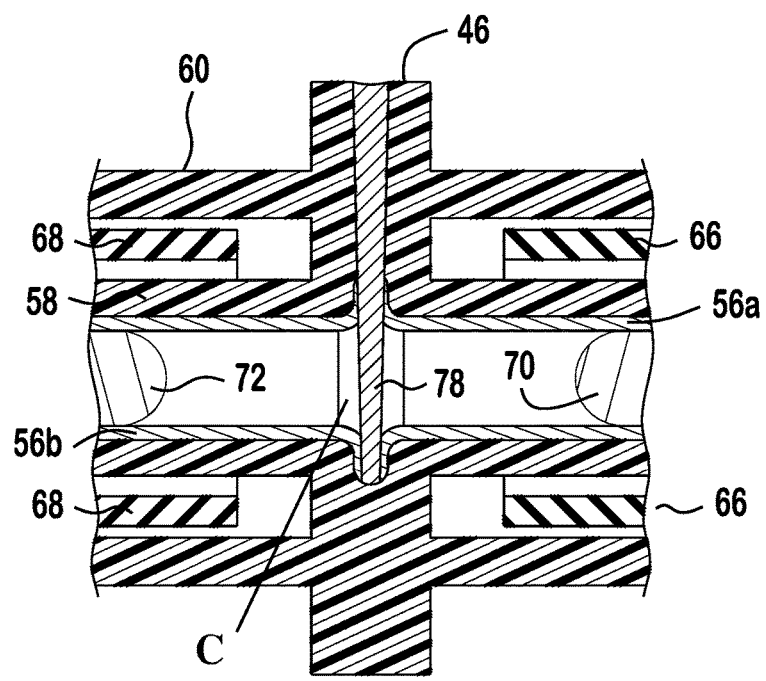
FIG. 11 is a sectional view of another alternative design of a portion of the electric circuit jumper shown in FIG. 5.
Figure 12:
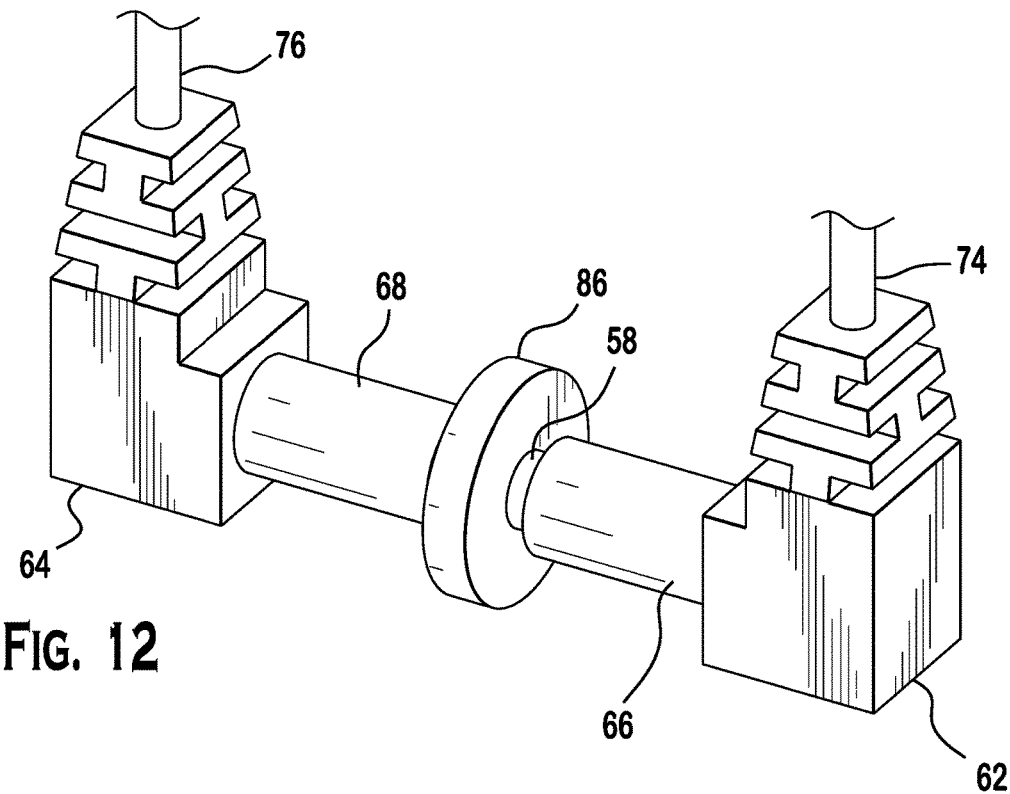
FIG. 12 is a perspective view of another embodiment of a coupling and electrical connectors of an electric circuit jumper constructed in accordance with the invention.
Figure 13:
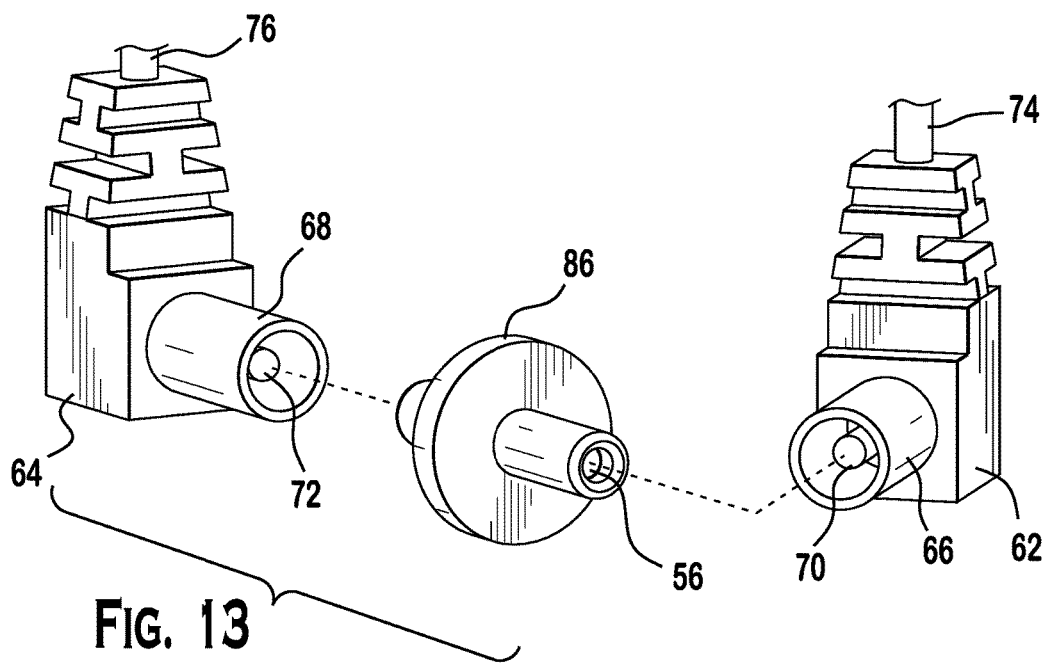
FIG. 13 is an exploded perspective view of the coupling and the electrical connectors of FIG. 12.
Figure 14:
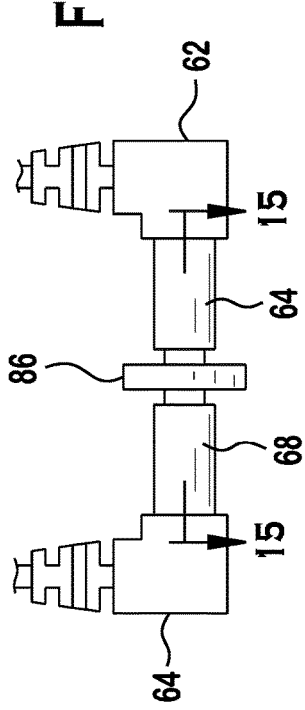
FIG. 14 is a side view of the coupling and the electrical connectors of FIG. 12.
Figure 15:
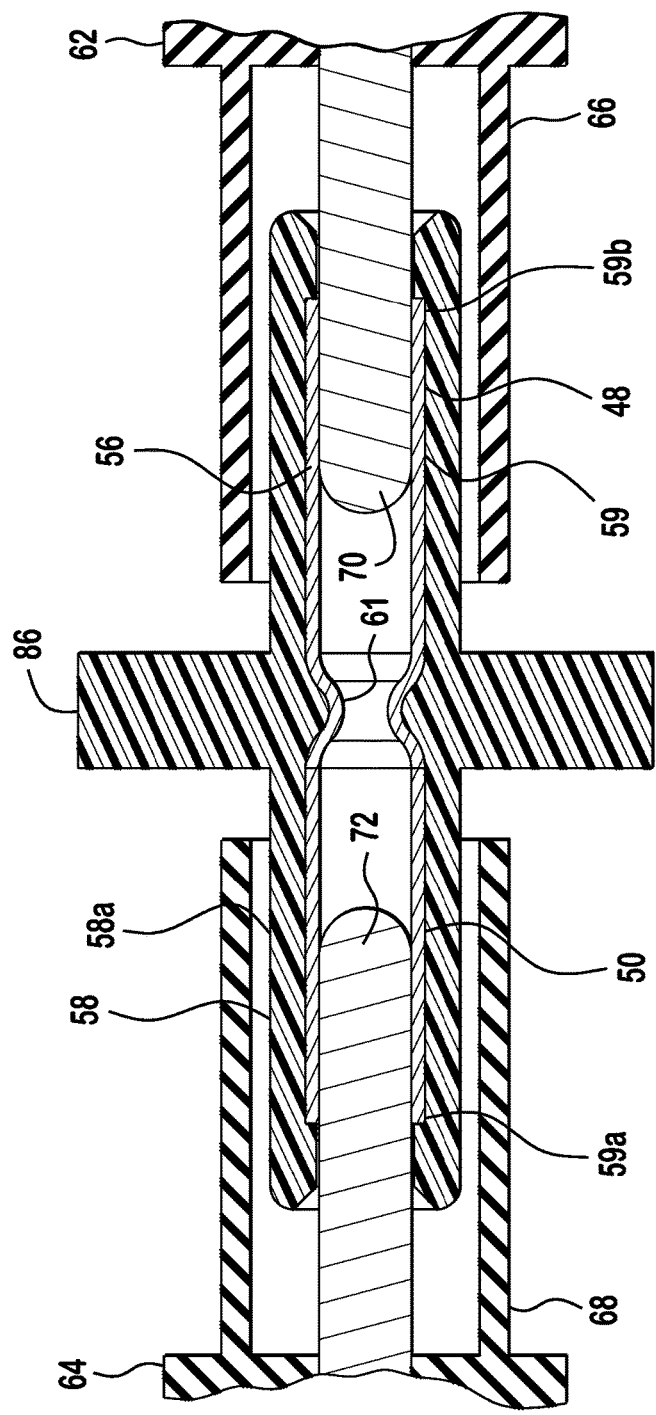
FIG. 15 is a sectional view of the coupling and the electrical connectors taken along line 5-5 of FIG. 14.

FIGS. 10 and 11 illustrate a coupling 46 that has a channel extending from an outer surface of the coupling into electrically conductive tubular sleeve 56. The channel c serves as a port to avoid vacuum locking as electrical terminals 70 and 72 are press-fit into electrically conductive tubular sleeve 56.

FIGS. 12 through 15 illustrate a second embodiment of a coupling constructed in accordance with the invention. The coupling 86 in FIGS. 12 through 15 differs from the couplings 46 described above and illustrated in FIGS. 2 through 11 by not having an outer tubular shell. Otherwise, the coupling 86 is similar to the couplings 46 described above and illustrated in FIGS. 2 through 11. The coupling 86 receives the electrical connectors 62 and 64 in the same way as the coupling 46 receives the electrical connectors.

The foregoing illustrates some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range of equivalents.

What is claimed is:

1. An electric circuit jumper comprising:
    a first probe having an electrically conductive tip;
    a second probe having an electrically conductive tip;
    a coupling having:
       a first electrical contact zone and a second electrical contact zone electrically connected to the first electrical contact zone,
       an insulation sleeve having a first section surrounding the first electrical contact zone; and
       an outer tubular shell covering the insulation sleeve such that an inner surface of the outer tubular shell is spaced from an outer surface of the insulation sleeve;
    a first electrical connector removably and electrically connected with the first electrical contact zone;
    a second electrical connector removably and electrically connected with the second electrical contact zone;
    a first wire electrically connecting the first probe and the first electrical connector; and
    a second wire electrically connecting the second probe and the second electrical connector.

2. The electric circuit jumper according to claim 1, wherein the first electrical contact zone is disposed at a first end of the coupling.

3. The electric circuit jumper according to claim 2, wherein the second electrical contact zone is disposed at a second end of the coupling positioned opposite the first end.

4. The electric circuit jumper according to claim 3, wherein the first electrical contact zone of the coupling and the second electrical contact zone of the coupling are electrically connected by an electrically conductive tubular sleeve.

5. The electric circuit jumper according to claim 4, wherein the electrically conductive tubular sleeve includes an annular dimple.

6. The electric circuit jumper according to claim 1, wherein the first electrical contact zone of the coupling and the second electrical contact zone of the coupling are electrically connected by an electrically conductive tubular sleeve.

7. The electric circuit jumper according to claim 1, wherein the first electrical connector includes a first electrical terminal removably press-fit into the first electrical con act zone.

8. The electric circuit jumper according to claim 7, wherein the second electrical connector includes a second electrical terminal removably press-fit in the second electrical contact zone.

9. The electric circuit jumper according to claim 8, wherein the insulation sleeve includes a sec section surrounding the second electrical contact zone.

10. The electric circuit jumper according to claim 9, wherein the first electrical connector includes a first cylindrical shell covering the first section of the insulation sleeve when removably press-fit into the first electrically conductive tubular sleeve.

11. The electric circuit jumper according to claim 10, wherein the second electrical connector includes a second cylindrical shell covering the second section of the insulation sleeve when removably press-fit into the second electrically conductive tubular sleeve.

12. The electric circuit jumper according to 11, further comprising a channel extending from an outer surface of the outer tubular shell and connecting the first electrically conductive tubular sleeve and the second electrically conductive tubular sleeve.

13. The electric circuit jumper according to claim 12, wherein the coupling is barrel shaped.

14. The electric circuit jumper according to claim 11, wherein the first cylindrical shell of the first electrical connector extends into a receiving passageway between the inner surface of the outer tubular shell of the coupling and the outer surface of the first section of the insulation sleeve.

15. The electric circuit jumper according to claim 14, wherein the second cylindrical shell of the second electrical connector extends into the space between the inner surface of the outer tubular shell of the coupling and the outer surface of the second insulation sleeve.

16. The electric circuit jumper according to claim 15, wherein the first electrical connector includes a first electrical terminal contact positioned and extending between the first cylindrical shell and removably contacting the first electrical contact zone in the coupling.

17. The electric circuit jumper according to claim 16, wherein the second electrical connector includes a second electrical terminal contact positioned and extending between the second cylindrical shell and removably contacting the second electrical contact zone in the coupling.

18. The electric circuit jumper according to claim 1, wherein the outer tubular shell includes a slot extending axially thereof.

19. An electric circuit jumper comprising:
a first probe having an electrically conductive tip;
a second probe having an electrically conductive tip;
a coupling having:
    a first electrical contact zone having a first electrically conductive tubular sleeve;
    a second electrical contact zone having a second electrically conductive tubular sleeve electrically connected to the first electrically conductive tubular sleeve by resistance component; and
    an outer tubular shell covering the first electrically conductive tubular sleeve and the second electrically conductive tubular sleeve such that an inner surface of the outer tubular shell is spaced from an outer surface of the first electrically conductive tubular sleeve and the second electrically conductive tubular sleeve;
a first electrical connector removably and electrically connected with the first electrical contact zone;
a second electrical connector removably and electrically connected with the second electrical contact zone;
a first wire electrically connecting the first probe and the first electrical connector; and
a second wire electrically connecting the second probe and the second electrical connector.

20. The electric circuit jumper according to claim 19, wherein the resistance component is a fuse.

21. The electric circuit jumper according to claim 20, wherein the fuse is removable through a channel extending through the coupling.

22. An electric circuit jumper comprising:
a first probe having an electrically conductive tip;
a second probe having an electrically conductive tip;
a coupling having:
    a first electrical contact zone with a first conductor tubular sleeve section and first insulation sleeve section covering the first conductor tubular sleeve section;
    a second electrical contact zone with a second conductor tubular sleeve section electrically connected to the first conductor tubular sleeve section and a second insulation sleeve section covering the second conductor tubular sleeve section; and
    an outer tubular shell covering the first conductor tubular sleeve section and the second conductor tubular sleeve section such that an inner surface of the outer tubular shell is spaced from an outer surface of the first insulation sleeve section and the second insulation sleeve section;
a first electrical connector having a first electrical terminal removably press-fit into a first end of the first conductor tubular sleeve section and a first cylindrical shell covering the first insulation sleeve section when removably press-fit into the first electrical contact zone;
a second electrical connector having a second electrical terminal removably press-fit into a second end of the first conductor tubular sleeve section and a second cylindrical shell covering the second insulation sleeve section when removably press-fit into the second electrical contact zone;
a first wire electrically connecting the first probe and the first electrical connector; and
a second wire electrically connecting the second probe and the second electrical connector.

23. The electric circuit jumper according to claim 22, wherein the coupling is barrel shaped.

24. The electric circuit jumper according to claim 22, wherein the first cylindrical shell of the first electrical connector extends into a first receiving passageway positioned between the inner surface of the outer tubular shell and the outer surface of the first insulation sleeve section.

25. The electric circuit jumper according to claim 24, wherein the second cylindrical shell of the second electrical connector extends into a second receiving space positioned between the inner surface of the outer tubular shell and the outer surface of the second insulation sleeve section.

\* \* \* \* \*

UNITED STATES PATENT AND TRADEMARK OFFICE
CERTIFICATE OF CORRECTION

PATENT NO. : 10,135,212 B2
APPLICATION NO. : 15/297571
DATED : November 20, 2018
INVENTOR(S) : Hughie Meehan It is certified that error appears in the above-identified patent and that said Letters Patent is hereby corrected as shown below:

In the Claims

In Column 5, Lines 19-20, Claim 7, "electrical con act zone." should read -- electrical contact zone. --

In Column 5, Line 26, Claim 9, "includes a sec section" should read -- includes a second section. --

In Column 5, Line 38, Claim 12, "The electric circuit jumper according to 11" should read -- The electric circuit jumper according to claim 11 --

Signed and Sealed this
Twenty-first Day of May, 2019

Andrei Iancu
*Director of the United States Patent and Trademark Office*